United States Patent
Zhai et al.

(10) Patent No.: US 7,923,741 B1
(45) Date of Patent: Apr. 12, 2011

(54) SEMICONDUCTOR LIGHTING DEVICE WITH REFLECTIVE REMOTE WAVELENGTH CONVERSION

(75) Inventors: Jinhui Zhai, Oldsmar, FL (US); Israel J. Morejon, Tampa, FL (US)

(73) Assignee: LEDnovation, Inc., Tampa, FL (US)

( * ) Notice: Subject to any disclaimer, the term of this patent is extended or adjusted under 35 U.S.C. 154(b) by 298 days.

(21) Appl. No.: 12/348,356

(22) Filed: Jan. 5, 2009

(51) Int. Cl.
*H01L 33/60* (2010.01)

(52) U.S. Cl. ...... 257/98; 257/99; 257/100; 257/E33.061

(58) Field of Classification Search ............ 257/E33.058
See application file for complete search history.

(56) References Cited

U.S. PATENT DOCUMENTS

| | | | |
|---|---|---|---|
| 6,547,423 B2* | 4/2003 | Marshall et al. | 362/333 |
| 7,061,454 B2 | 6/2006 | Sasuga et al. | |
| 7,390,684 B2 | 6/2008 | Izuno et al. | |
| 7,543,959 B2* | 6/2009 | Bierhuizen et al. | 362/293 |
| 7,547,114 B2* | 6/2009 | Li et al. | 362/231 |
| 2008/0054281 A1 | 3/2008 | Narendran et al. | |
| 2008/0094829 A1 | 4/2008 | Narendran et al. | |
| 2008/0105887 A1 | 5/2008 | Narendran et al. | |
| 2008/0149166 A1* | 6/2008 | Beeson et al. | 136/248 |
| 2009/0283784 A1* | 11/2009 | Chang | 257/98 |

* cited by examiner

*Primary Examiner* — Stephen W Smoot
(74) *Attorney, Agent, or Firm* — Molly L. Sauter; Smith & Hopen, P.A.

(57) ABSTRACT

A semiconductor lighting device includes at least one semiconductor light emitter and at least one wavelength converting element, physically separated from the light emitter. At least one wavelength converting element has a reflective member underneath it, so that both primary light and converted light from the wavelength converting layer become a forward transferred light preventing from backscattering loss into the light emitter. The reflective member may be a thermal conductive element to effectively remove the heat from the wavelength converting element. Accordingly, the remote wavelength conversion on a reflective surface improves the thermal stability of the wavelength conversion material and prevents backscattering loss to produce a higher radiance result from the device.

29 Claims, 3 Drawing Sheets

SEMICONDUCTOR LIGHTING DEVICE WITH REFLECTIVE REMOTE WAVELENGTH CONVERSION

BACKGROUND OF THE INVENTION

1. Field of the Invention

The invention relates generally to semiconductor lighting devices, as well as related components, systems and methods, and more particularly to a method of remote wavelength conversion to produce white light from a semiconductor light emitter.

2. Background of the Invention

A typical semiconductor light emitting device utilizes a blue light emitting diode (LED) having a main emission peak in blue wavelength range from 400 nm to 490 nm, and a luminescent layer containing an inorganic phosphor that absorbs blue light emitted by the blue LED and produces an exciting light having an emission peak in a visible wavelength range from green to yellow. The mixture of emitted blue light and excited yellow light produces a white light with correlated color temperature (CCT) around 6500K.

Light emitting semiconductor devices known in the art place a phosphor layer in the light emitting path of the light emitting diode for wavelength conversion of the emitted light. The phosphor layer may be disposed in the path of the forward light emitted by a semiconductor light emitting diode utilizing various methods known in the art. For example, it is known in the art to utilize an III-nitride LED die covered by a layer of transparent resin in which a wavelength conversion material is mixed. LED devices grown on single crystal luminescent substrates are also known in the art in addition to thin film phosphor layers deposited over LEDs and conformal phosphor layers deposited on LEDs by electro-phoretic deposition. A phosphor layer directly formed on an LED die or a wavelength material mixed into an epoxy resin to encapsulate the LED die must be able to handle the temperature rise in the LED die itself. Additionally, the intrinsic phosphor conversion efficiency of some phosphors drops dramatically as the temperature increases above a threshold of approximately 90° C. In addition, over time, phosphors directly-attached to an LED die will be subjected to increased phosphor degradation as a result of heat from the LED die.

Current state-of-the-art phosphor-converted LED (Pc-LED) technology is inefficient due to backscattering issues. Phosphor particles within a luminescent layer or cured encapsulation layer are randomly oriented and the size of the phosphor particles is about 5-50 µm, which is much larger than the wavelength of visible light. As such, a portion of the primary short wavelength light emitted by the LED passes through the phosphor layer without impinging on the phosphor particles, and another portion of the primary light emitted by the LED impinges on the phosphor particles, thereby causing the phosphor particles to emit longer wavelength radiation or scatter the primary short wavelength light. The impingement of primary short wavelength light onto a down-conversion phosphor layer may produce radiations with four components: a forward-transferred down-converted radiation transmitted through the phosphor layer; a back-transferred down-converted radiation reflected from the phosphor layer; a back-transferred primary short wavelength light reflected from the phosphor layer; and a forward transferred primary short wavelength light transmitted through the phosphor layer. The combination of the forward-transferred primary short wavelength radiation and the forward-transferred down-converted radiation produces white light. But, the back-transferred primary short wavelength radiation and back-transferred down-converted radiation will primarily be reflected back into the primary LED chip in accordance with the current state-of-the art Pc-LED in which the phosphor layer is directly applied to the LED die, thus causing significant phosphor conversion back-scattering loss.

There remains a need, therefore, for an improved phosphor converted semiconductor lighting device that overcomes phosphor conversion back-scattering loss and phosphor degradation resulting from heat.

However, in view of the prior art taken as a whole at the time the present invention was made, it was not obvious to those of ordinary skill how the identified need could be fulfilled.

SUMMARY OF THE INVENTION

The long-standing but heretofore unfulfilled need for an apparatus and method for an improved phosphor converted semiconductor lighting device that overcomes phosphor conversion back-scattering loss and phosphor degradation resulting from heat is now met by a new, useful, and non-obvious invention.

In general, the phosphor converted semiconductor lighting device of the present invention provides a system including a reflective remote wavelength conversion medium within the semiconductor lighting device. In accordance with an embodiment of the present invention, a semiconductor light emitting device generates a white light wherein the wavelength conversion occurs on a reflective cavity wall.

In a first embodiment, a novel phosphor converted semiconductor lighting device is provided which includes a wavelength conversion cavity, the wavelength conversion cavity having a reflective interior surface and a first wavelength conversion element positioned to substantially cover the reflective interior surface, at least one semiconductor light emitting element secured within the wavelength conversion cavity, a high refractive index encapsulation material positioned to substantially fill the wavelength conversion cavity, the interface between the high refractive index encapsulation material and the air forming a light extraction surface and a deflector element positioned in a light emitting forward path of the semiconductor light emitting element so that at least a portion of the primary light having a first wavelength emitted by the at least one semiconductor light emitting element will be deflected by the deflector element onto the first wavelength conversion element and converted into a secondary light having a second wavelength.

The deflector element may be positioned within the encapsulation material at the light extraction surface or the deflector element may substantially cover the encapsulation material at the light extraction surface.

The semiconductor light emitting elements may be secured to a bottom interior surface of the wavelength conversion cavity or to the sidewalls of the wavelength conversion cavity.

The reflective interior surface is thermally conductive to reduce the heat buildup from the semiconductor light emitting elements.

The first wavelength conversion element may be polymer phosphor film deposited on the reflective interior surface of the wavelength conversion cavity.

The semiconductor light emitting element may be a primary blue light emitting element and the first wavelength conversion element is a wavelength down-conversion layer.

The semiconductor light emitting element may be a near-UV light emitting element and the first wavelength conversion element is a wavelength down-conversion layer including blue, green and red quantum dots.

The semiconductor light emitting element may be an infrared light emitting element and the first wavelength conversion element includes an up-conversion material.

In a particular embodiment, the wavelength conversion cavity is frusto-conical in shape, the semiconductor light emitting element is positioned at a bottom surface of the wavelength conversion cavity and the deflector element is positioned within the encapsulation material at the light extraction surface. Additionally, the encapsulation material may hemispherical in shape with an indented conical apex that is proximate to the semiconductor light emitting element and the deflector element may be conical in shape to substantially cover the conical apex of the encapsulation material at the light extraction surface.

In an additional embodiment, the wavelength conversion cavity is frusto-conical is shape, the semiconductor light emitting element is positioned at a bottom surface of the wavelength conversion cavity and the deflector element is a disk-shaped dichroic filter positioned to substantially cover the encapsulation material at the light extraction surface. Additionally, the deflector element may have an indented conical apex that is directed proximate to the at least one semiconductor light emitting element.

In a second embodiment, a novel phosphor solid state lighting device includes a wavelength conversion cavity, the wavelength conversion cavity having a reflective interior surface and a first wavelength conversion element positioned to substantially cover the reflective interior surface, at least one packaged semiconductor light emitting device secured within the wavelength conversion cavity and a deflector element positioned in a light emitting forward path of the packaged semiconductor light emitting device so that at least a portion of the primary light having a first wavelength emitted by the at least one packaged semiconductor light emitting device will be deflected by the deflector element onto the first wavelength conversion element and converted into a secondary light having a second wavelength.

In a particular embodiment of the solid state lighting device of the present invention, a second wavelength conversion element is positioned to receive at least a portion of the primary light emitted by the at least one packaged semiconductor light emitting device, the secondary wavelength conversion element to convert at least a portion of the primary light to a tertiary light having a third wavelength. The combination of the primary light, the secondary light and the tertiary light form a high color white light. A diffuser may be positioned over the dichroic filter.

In an additional embodiment of the solid state lighting device of the present invention, the at least one packaged semiconductor light emitting device further comprises a first semiconductor light emitting element to emit the primary light and a second semiconductor light emitting element to emit a tertiary light having a third wavelength. The combination of the primary light, the secondary light and the tertiary light form a high color white light. A diffuser may be positioned over the dichroic filter.

In a particular embodiment, the deflector element is a conical shaped dichroic filter and in an additional embodiment, the deflector element is a substantially flat disk shaped dichroic filter.

In a specific embodiment of the solid state lighting device of the present invention, the primary light is a blue light, the secondary light is a yellow light and the tertiary light is a reddish orange light.

In the solid state lighting device of the present invention, the at least one packaged semiconductor light emitting device may be positioned on a sidewall of the wavelength conversion cavity and the reflective interior surface further comprises a central dome and a flat flange circumscribing the central dome positioned a bottom surface of the wavelength conversion cavity.

An object of the present invention is to suppress phosphor converting back-scattering loss and phosphor degradation issues of known phosphor-converted (PC) semiconductor lighting devices by utilizing a reflective remote phosphor conversion method to provide a semiconductor white light emitting device and a high color reproduction solid state lighting device exhibiting a high wavelength converting efficiency and a less phosphor degradation.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
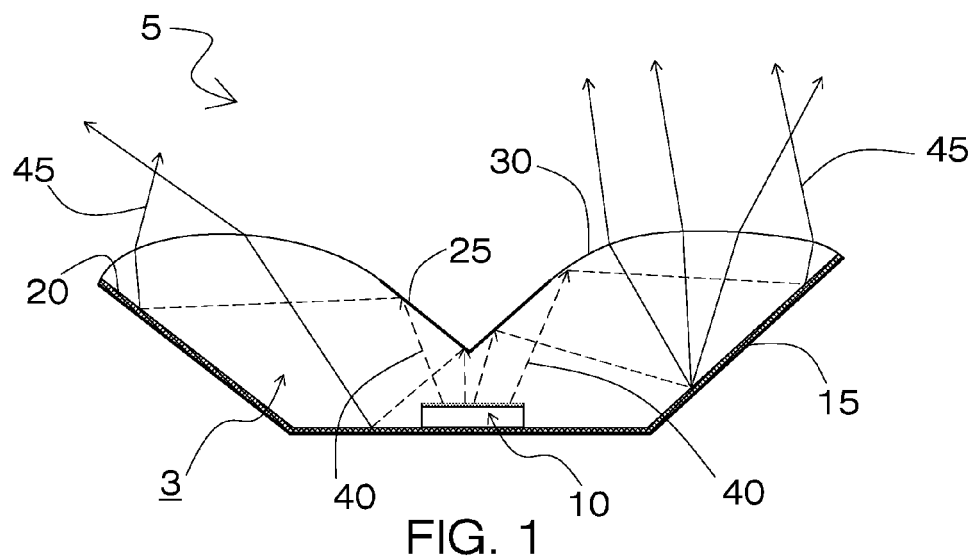
FIG. 1 is a diagrammatic view of a first embodiment in accordance with the present invention.

Referring now to FIG. 1, it will be seen that an illustrative embodiment of the invention is denoted as a whole by the reference numeral 5.

In the embodiment of FIG. 1, semiconductor white light emitting device 5 includes at least one semiconductor light emitting element 10 and a remote wavelength conversion layer 20 deposited on a reflective interior surface of a wavelength conversion cavity 15. A high refractive index encapsulation material 35 is positioned to substantially fill the wavelength conversion cavity, thereby forming a light extraction surface 30 at the interface between the encapsulation material 35 and the air. The semiconductor light emitting device 5 further includes a deflector element 25 positioned within the encapsulation material 35 at the light extraction surface 30 and in a primary light emitting forward path of the semiconductor light emitting element 10.

In FIG. 1, the semiconductor white lighting device 5 comprises at least one semiconductor light emitting element 10 packaged on a thermal conductive substrate to emit a primary light 40, at least one wavelength converting layer 20 disposed on a the reflective substrate of the wavelength conversion cavity 15 to convert the primary light 40 and direct the converted/unconverted light into a forward-transferred light 45 and one deflective member 25 disposed on the light emitting forward path to re-direct the primary light 40 onto the wavelength converting element 20. The reflective substrate of the wavelength conversion cavity 15 under wavelength conversion layer 20 may be a thermal conductive element to effectively remove the heat from the wavelength converting element to improve emission efficiency. In a particular embodiment, the combination of the primary light 40 and at least one excited second light 45 produces a white light within ten MacAdam ellipses with at least one point on blackbody locus at 1931 CIE chromaticity diagram.

In a particular embodiment, the semiconductor light emitting device 5 includes a semiconductor light emitting element 10 that is a primary blue light emitting component packaged inside of the wavelength conversion cavity 15 with a wavelength down-conversion layer 20 deposited on the reflective wall. A deflective member 25 is disposed within the light emitting forward path in the encapsulation material inside the LED package to re-direct the primary light 40 onto the wavelength down-converting layer 20. The wavelength converting layer 20 deposited on the side wall and bottom of the conversion cavity 15 absorbs the primary blue light and converts it into a second spectrum light in a yellow color or a sub-mixture red and green colors. Some of the primary blue light may be leakage from the deflector element 25 or may have not been converted by the wavelength down-conversion layer 20 and reflected by the reflective substrate 15 into a forward-transferred light. The combination of primary blue light and converted second light produces a mixture white light which is then output from the semiconductor light emitting device through the light extraction surface 30.

In an additional embodiment, the primary light 40 from the semiconductor light emitting element 10 may be a near-UV light with peak wavelength from 380 nm-420 nm. In this embodiment, the wavelength down-conversion layer 20 includes blue, green and red quantum dots.

In another embodiment, the primary light 40 from the semiconductor light emitting element 10 may be an infrared light. In this embodiment, the wavelength conversion layer 20 includes an up-conversion material to absorb infrared primary light and convert it into one or more wavelength spectrums.

Figure 2:
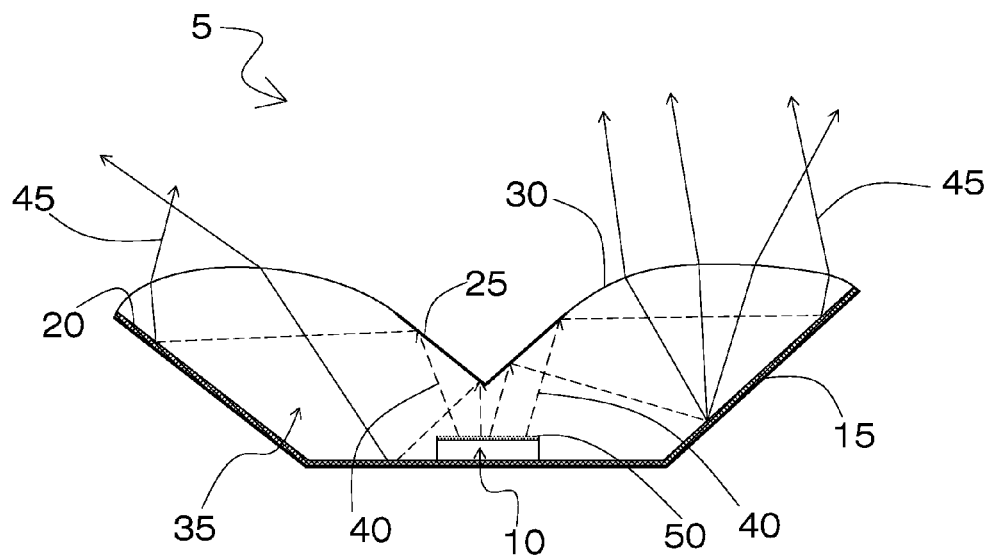
FIG. 2 is a diagrammatic view of a second embodiment in accordance with the present invention.

In an additional embodiment, with reference to FIG. 2, the semiconductor light emitting element 10 may have a filter 50 deposited on the top surface. The filter 50 is effective in passing the primary light 40, but reflects the converted light 45.

The semiconductor lighting element 10 may be a flip-chip semiconductor emitter with an enhanced light extraction component packaged inside the conversion cavity 15.

The deflective member 25 may be a reflector cone embedded into the LED encapsulation 35 and positioned above the light emitting element 10. The shape of the encapsulation layer 35 and deflective member 25 may be specifically designed such that the narrow angle primary light from the light emitting component is reflected by the reflector cone onto the wavelength conversion cavity wall and the wide angle primary light from the light emitting component is totally internal reflected by the encapsulation layer interface surface 30 onto the wavelength conversion layer 20 at the conversion cavity wall. The back-transferred primary light is absorbed by the wavelength conversion layer 20 and converted into a forward second light and extracted from the encapsulation to air interface 30. Some of the primary light may be leakage from the reflector cone and the encapsulation to air interface.

Figure 3:
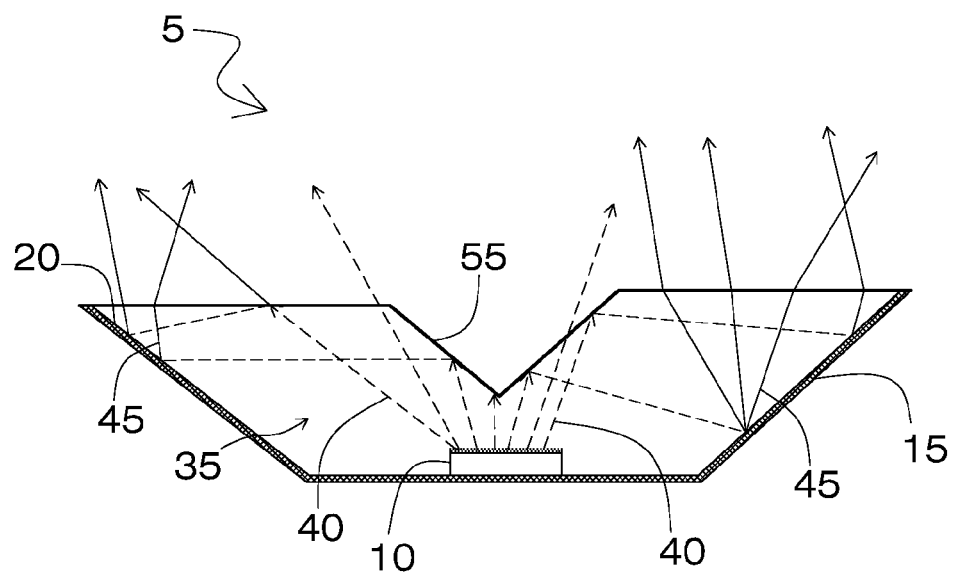
FIG. 3 is a diagrammatic view of a third embodiment in accordance with the present invention.

With reference to FIG. 3, in an additional embodiment, the deflective member may be a dichroic filter 55 on the LED encapsulation 35 to air interface to reflect the primary light 40, but pass through the converted light 45. The primary light 40 from the light emitting element 40 is reflected by the dichroic filter 55 onto the wavelength conversion layer 20 positioned on the conversion cavity wall 15 for wavelength conversion and the converted light 45 is extracted from the dichroic filter 55. Some of the primary light 40 may be leakage from the dichroic filter 55 at the encapsulation 35 to air interface.

The LED encapsulation 35 may be a molded part with the deflective coating 25 or dichroic filter coating 55 disposed at the air interface. Alternatively, the deflective member 25 may be a separated from the encapsulation layer 35 and have an air gap between the deflective member 25 and the light emitting components.

Figure 4:
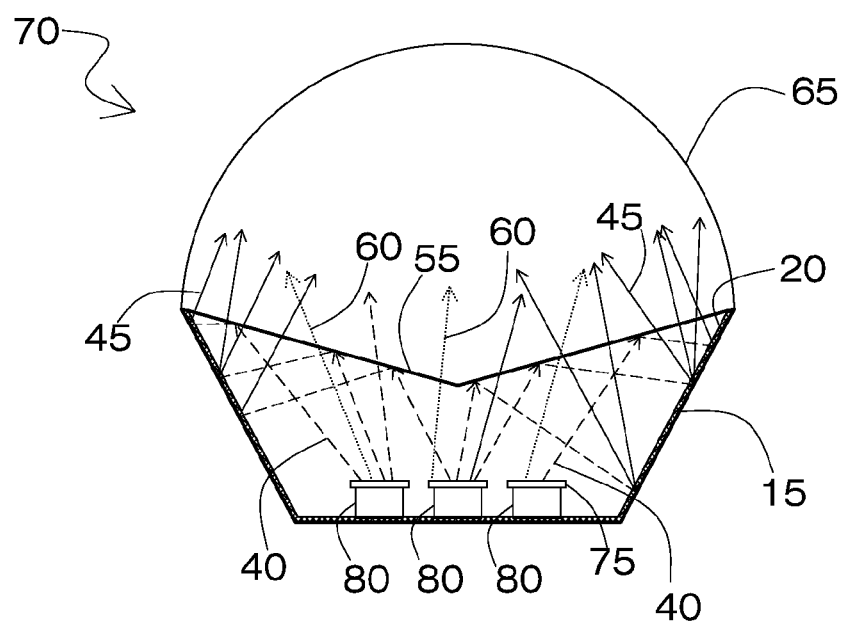
FIG. 4 is a diagrammatic view of a fourth embodiment in accordance with the present invention.

With reference to FIG. 4, in an additional embodiment, a solid state lighting device 70 to generate a high color rendering white light is described. In this embodiment, a solid state lighting device 70 includes with at least one packaged semiconductor light emitting device 80 positioned within a wavelength conversion cavity and at least one wavelength converting layer 20 deposited on the wavelength conversion cavity having a reflective interior surface 15 for remote wavelength conversion. In this embodiment, the packaged semiconductor light emitting device 80 includes a semiconductor light emitting element 5 and an associated encapsulation material 35 to enclose the semiconductor light emitting element 5 and to therefore provide a packaged semiconductor light emitting device 80.

The solid state lighting device 70 in accordance with the present invention comprises at least one packaged semiconductor light emitting device 80 positioned on a thermal conductive substrate to emit a primary light 40, at least one wavelength conversion layer 20 disposed on a reflective conversion cavity 15. The conversion layer 20 is effective in converting the primary light 40 and directing the converted/unconverted light into a forward-transferred second light 45. In this embodiment, at least a third light in reddish orange color 60 is provided. The third light is either emitted from at least one of the packaged semiconductor light emitting devices 80 or excited from the first primary light 40. A deflector element 25 is disposed within the light emitting forward path to re-direct the primary light 40 onto the wavelength conversion layer 20. The reflective substrate 15 underneath the wavelength conversion layer 20 may further comprise a thermal conductive element to effectively remove the heat generated by the packaged LEDs 80 from the wavelength conversion layer 20 to improve emission efficiency. The combination of the primary light 40, at least one excited long wavelength second light 45 and a third reddish orange light produce a white light with a good color rendering index at least 80.

In the embodiment illustrated in FIG. 4, the solid state lighting device 70 includes at least one primary blue light emitting device 80, at least one wavelength conversion layer 20 deposited on the conversion cavity wall 15 of the solid state lighting device 70 to excite a long wavelength second light 45 and at least a third emission reddish orange light 60 to compensate for the shortage of red light from the excited yellow light. The wavelength conversion layer 20 deposited on the conversion cavity wall 15 of the solid state lighting device 70 absorbs the primary blue light 40 and converts it into a second spectrum light in a yellow color 45. A third emission reddish orange light 60 is either emitted from the semiconductor light emitting device 80 or excited from a second wavelength conversion material 75 to compensate for the shortage of red spectrum in the excited yellow light. Some of the primary blue light may be leakage from the deflective member or may have not been converted by the wavelength down-conversion layer 20 and reflected by the reflective substrate 15 into a forward-transferred light. The combination of primary blue light 40 and converted second yellow light 45 and third reddish orange light 60 produces a mixture white light with a good color rendering index and output from the solid state lighting device 70.

In a particular embodiment of the solid state lighting device 70 of the present invention, the primary light from the packaged semiconductor light emitting device 80 may be a near-UV light with peak wavelength from 380 nm-420 nm. In this embodiment, the wavelength down-conversion layer 20 includes blue, green and red quantum dots.

In an additional embodiment of the solid state lighting device of the present invention 70, the primary light from the packaged semiconductor light emitting device 80 may be an infrared light. In this embodiment, the wavelength conversion layer 20 includes an up-conversion material to absorb infrared primary light and convert it into one or more wavelength spectrums.

In accordance with another embodiment of the present invention, the packaged semiconductor light emitting devices 80 may include at least one primary blue light emitter and at least one reddish orange light emitter. The reddish orange emitting light has a peak wavelength range from 610 nm-620 nm. In this embodiment, the deflector element is a dichroic filter that is used to re-direct the primary blue light 40 onto the wavelength down-conversion layer 20 of the reflective wall 15, but to pass through at least 95% of the emitted reddish orange light 60 and excited yellow light 45. Some of primary blue light is leakage from the dichroic filter. The combination of leakage blue light 40, emitted reddish orange light 60 and excited yellow light 45 produces a white light with a good color rendering index of at least 80. The percentage of leakage primary blue light and reflected primary blue light of the dichroic filter and the ratio of number of reddish orange light emitters versus number of blue light emitters can be used to reconfigure the correlated color temperature (CCT) of the solid state lighting device.

The solid state lighting device may include at least one primary blue light emitting device 80. In this case, the reflective remote wavelength conversion layer absorbs the primary blue light 40 and converts it into the second yellow light 45. The third reddish orange light 60 is excited by a second wavelength conversion material 75. The second wavelength conversion material 75 is either directly coated on the primary blue light emitting device 80 or added into the first wavelength conversion material 20. The combination of the emitted primary light 40, the excited yellow second light 45 and the third reddish orange light 60 produces a white light with a high color rendering index at least 80.

The wavelength conversion layer 20 may be a phosphor coating on top of the interior conversion cavity wall 15, or the wavelength conversion layer 20 may be a separated ceramic wavelength conversion plate, a lumiramic phosphor plate, or a polymer phosphor film disposed on top of the conversion cavity wall 15 inside the solid state lighting device 70.

A diffuser 65 may be needed to diffuse the mixed light. As shown with reference to FIG. 4, the diffuser 65 may be positioned around a periphery of the dichroic filter 25. In this embodiment, the diffuser 65 is hemispherical in shape, although various shapes are within the scope of the present invention.

Figure 5:
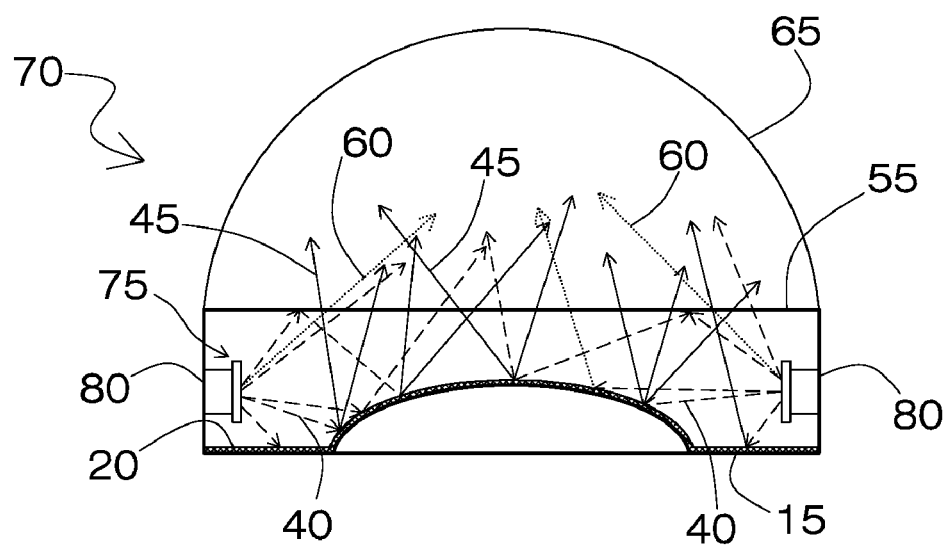
FIG. 5 is a diagrammatic view of a fifth embodiment in accordance with the present invention.

As shown with reference to FIG. 5, the solid state lighting device 70 may include a plurality of packaged semiconductor light emitting devices 80 mounted around the side walls of the conversion cavity 15 and facing towards a center axis. In this embodiment, the conversion cavity has a reflective interior surface 15 covered with a wavelength conversion layer 20 deposited on its top to absorb the primary blue light emitted from the packaged semiconductor lighting devices 80 and to convert the blue light into a long wavelength light and to then reflect the converted light into a forward transferred light. A dichroic filter 55 is positioned over the semiconductor light emitting devices 80 to serve as a deflector element to re-direct the primary blue light and pass through the light with wavelengths longer than 500 nm. In a particular embodiment, the conversion layer 20 may be a dome shape in the center. In this embodiment, a diffuser 65 may be needed to diffuse the output light.

In some embodiments according to the present invention, a group of packaged semiconductor light emitting devices 80 are mounted around the interior wall of the solid state lighting device facing to the center axis. The light emitting devices 80 emit at least one primary blue light 40 and at least one reddish orange light 60. The reddish orange light 60 will pass through the dichroic filter 55 without converted by the wavelength conversion material 20. The primary blue light 40 directly hits the wavelength conversion layer 20 or hits the wavelength conversion layer 20 after reflected by the dichroic filter 55. The wavelength conversion layer 20, with a reflective member underneath, absorbs the primary blue light 40 and converts it into a long wavelength light 45, preferably in yellow color. Some of primary blue light 40 is leakage at the dichroic filter 55. The combination of the leakage primary light 40, emitted reddish orange light 60, and the excited yellow light 45 produces a white light with a high color rendering index at least 80.

In some embodiments according to the present invention, a group of semiconductor light emitting devices 80 are mounted around the interior wall of the solid state lighting device facing to the center axis. The light emitting devices 80 emit at least one primary blue light 40 and have a reddish orange phosphor coated on it 75. Some of primary blue light 40 is absorbed by the reddish orange phosphor 75 and converted into reddish orange light 60. Some of primary blue light 40 is passed through the reddish orange phosphor layer 75, but reflected by the dichroic plate 55 onto the first wavelength conversion layer 20 with reflective member underneath it and converted by the first wavelength conversion layer 20 into a yellow light 45. Some of primary blue light 40 is leakage from the dichroic filter 55. The combination of the leakage primary light 40 and the excited reddish orange light 60 and yellow light 45 produces a white light with a high color rendering index at least 80.

In some embodiments of the present invention, the light emitting devices 80 emit near-UV light with peak wavelength range from 380-420 nm. The dichroic filter 55 reflects short near-UV wavelength, but passes through 95% of the visible light with peak wavelength from 430 nm-700 nm. The wavelength conversion layer 20 with reflective member underneath it includes at least a blue, a green and a red quantum dots. The combination of the excited blue light, green light and red light produce a white light with a high color rendering index at least 80.

In some embodiments the wavelength converting element 20 on top of reflective member may be a separated ceramic wavelength conversion plate, a lumiramic phosphor plate, or a polymer phosphor film disposed on top of the conversion cavity wall inside the solid state lighting device.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A phosphor converted, semiconductor lighting device, comprising:
    a wavelength conversion cavity, the wavelength conversion cavity having a reflective interior surface and a first wavelength conversion element positioned to substantially cover the reflective interior surface;
    at least one semiconductor light emitting element secured within the wavelength conversion cavity;
    a high refractive index encapsulation material positioned to substantially fill the wavelength conversion cavity, the interface between the high refractive index encapsulation material and the air forming a light extraction surface; and
    a deflector element positioned in a light emitting forward path of the semiconductor light emitting element so that at least a portion of the primary light having a first wavelength emitted by the at least one semiconductor light emitting element will be deflected by the deflector element onto the first wavelength conversion element and converted into a secondary light having a second wavelength.

2. The semiconductor lighting device of claim 1, wherein the deflector element is positioned within the encapsulation material at the light extraction surface.

3. The semiconductor lighting device of claim 2, wherein the deflector element is a substantially planar disk shaped dichroic filter having an indented conical apex that is directed proximate to the at least one semiconductor light emitting element.

4. The semiconductor lighting device of claim 2, wherein the light extraction surface formed by the encapsulation material is hemispherical in shape with an indented conical apex that is directed proximate to the at least one semiconductor light emitting element and the deflector element is conical in shape and is positioned to cover the apex of the encapsulation material at the light extraction surface.

5. The semiconductor lighting device of claim 1, wherein the deflector element substantially covers the encapsulation material at the light extraction surface.

6. The semiconductor lighting device of claim 1, wherein the at least one semiconductor light emitting element is secured to a bottom interior surface of the wavelength conversion cavity.

7. The semiconductor lighting device of claim 1, wherein the reflective interior surface is thermally conductive.

8. The semiconductor lighting device of claim 1, wherein the first wavelength conversion element is a polymer phosphor film deposited on the reflective interior surface of the wavelength conversion cavity.

9. The semiconductor lighting device of claim 1, wherein the at least one semiconductor light emitting element is a primary blue light emitting element and the first wavelength conversion element is a wavelength down-conversion layer.

10. The semiconductor lighting device of claim 1, wherein the at least one semiconductor light emitting element is a near-UV light emitting element and the first wavelength conversion element is a wavelength down-conversion layer including blue, green and red quantum dots.

11. The semiconductor lighting device of claim 1, wherein the at least one semiconductor light emitting element is an infrared light emitting element and the first wavelength conversion element includes an up-conversion material.

12. The semiconductor lighting device of claim 1, wherein the wavelength conversion cavity is frusto-conical in shape.

13. The semiconductor lighting device of claim 1, wherein the deflector element is a dichroic filter.

14. The semiconductor lighting device of claim 1, further comprising a source of electrical power in electrical communication with the at least one semiconductor lighting element.

15. A phosphor converted, solid state lighting device, comprising:
    a wavelength conversion cavity, the wavelength conversion cavity having a reflective interior surface and a first wavelength conversion element positioned to substantially cover the reflective interior surface;
    at least one packaged semiconductor light emitting device secured within the wavelength conversion cavity; and
    a deflector element positioned to surround the periphery of the wavelength conversion cavity and in a light emitting forward path of the packaged semiconductor light emitting device so that at least a portion of the primary light having a first wavelength emitted by the at least one packaged semiconductor light emitting device will be deflected by the deflector element onto the first wavelength conversion element and converted into a secondary light having a second wavelength.

16. The solid state lighting device of claim 15, wherein the first wavelength conversion element is selected from the group consisting of, a polymer phosphor film deposited on the reflective interior surface of the wavelength conversion cavity, a separated ceramic wavelength conversion plate and a lumiramic phosphor plate.

17. The solid state lighting device of claim 15, further comprising a second wavelength conversion element positioned to receive at least a portion of the primary light emitted by the at least one packaged semiconductor light emitting device, the second wavelength conversion element to convert at least a portion of the primary light to a tertiary light having a third wavelength.

18. The solid state lighting device of claim 17, wherein the second wavelength conversion element is positioned adjacent to the at least one packaged semiconductor light emitting device.

19. The solid state lighting device of claim 17, wherein the second wavelength conversion element is integrated within the first wavelength conversion element.

20. The solid state lighting device of claim 17, wherein the combination of the primary light, the secondary light and the tertiary light form a high color rendering white light.

21. The solid state lighting device of claim 17, wherein the primary light is a blue light, the secondary light is a yellow light and the tertiary light is a reddish orange light.

22. The solid state lighting device of claim 15, wherein the at least one packaged semiconductor light emitting device further comprises a first packaged semiconductor light emitting device to emit the primary light and a second packaged semiconductor light emitting device to emit a tertiary light having a third wavelength.

23. The solid state lighting device of claim 20, wherein the combination of the primary light, the secondary light and the tertiary light form a high color rendering white light.

24. The solid state lighting device of claim 20, wherein the primary light is a blue light, the secondary light is a yellow light and the tertiary light is a reddish orange light.

25. The solid state lighting device of claim 15, wherein the deflector element is a conical shaped dichroic filter.

26. The solid state lighting device of claim 15, wherein the deflector element is a substantially flat disk shaped dichroic filter.

27. The solid state lighting device of claim 15, further comprising a diffuser element attached to the periphery of the deflector element.

28. The solid state lighting device of claim 15, wherein the at least one packaged semiconductor light emitting device is positioned on a sidewall of the wavelength conversion cavity and the reflective interior surface further comprises a central dome and a flat flange circumscribing the central dome positioned a bottom surface of the wavelength conversion cavity.

29. The solid state lighting device of claim 15, wherein the packaged semiconductor light emitting device comprises at least one light emitting element positioned within an encapsulation material.

* * * * *